United States Patent [19]

Kleinberg

[11] Patent Number: 5,784,692
[45] Date of Patent: Jul. 21, 1998

[54] METHOD AND APPARATUS FOR GENERATING NON-LINEAR VARIABLE IMPEDANCE

[75] Inventor: Leonard L. Kleinberg, Greenbelt, Md.

[73] Assignee: Neillen Technologies, Corp., Mitchellville, Md.

[21] Appl. No.: 665,834

[22] Filed: Jun. 19, 1996

[51] Int. Cl.$^6$ ...................................................... H04B 1/28
[52] U.S. Cl. .......................... 455/333; 455/320; 455/326; 455/330; 330/300; 329/702; 329/326; 327/478
[58] Field of Search .................................. 455/330, 326, 455/318–320, 141, 147, 261, 262, 333, 341; 330/300; 329/323, 326, 302; 327/478, 482, 574, 358

[56] References Cited

U.S. PATENT DOCUMENTS

| | | | |
|---|---|---|---|
| 3,723,755 | 3/1973 | Morse | 331/107 |
| 4,663,599 | 5/1987 | Patch | 330/310 |
| 5,465,418 | 11/1995 | Zhou et al. | 455/332 |
| 5,589,791 | 12/1996 | Gilbert | 330/254 |

OTHER PUBLICATIONS

Neillen Technologies Corporation "Corporate Briefing", Apr. 1995,pp. 1, 2, 16, 17, and 20.

Neillen Technologies Corporation "Corporate Overview", pp. 1, 6, and 7 Jun. 1996.

*Primary Examiner*—Donnie L. Crosland
*Attorney, Agent, or Firm*—Banner & Witcoff, Ltd.

[57] ABSTRACT

An impedance-generating device that provides a resistance and a reactance that are non-linear functions of a signal over a wide impedance range (VariablE Non-Linear Impedance Circuit Electronics, "VENICE"). An electronic component that has a gain characteristic with a unity gain frequency that is directly proportional to that signal can be configured to generate such an impedance. Such an electronic component configured to provide a negative effective resistance and a variable non-linear reactance can be used to implement a high frequency harmonic generator. This generator can provide high order harmonics which can be used in high frequency communications systems. The electronic component can also be configured to provide only a voltage-variable non-linear reactance which can be used to implement a reactive mixer to frequency shift a high frequency signal to an intermediate frequency signal, from mixing the high frequency signal with a local oscillator signal. This mixer provides a gain, at the intermediate frequency, that is the unity gain frequency of the electronic component divided by the intermediate frequency. Two stages of such mixers can be used in a homodyne circuit to generate the intermediate frequency signal without the use of off-chip bandpass filters. Also, an amplification to the intermediate frequency signal generated by the mixing can be used to implement a RF amplifier from the further modulation of this intermediate frequency signal on the local oscillator signal. These impedance-generating devices can thus implement high performance electronic circuits for communications applications.

37 Claims, 6 Drawing Sheets

5,784,692

METHOD AND APPARATUS FOR GENERATING NON-LINEAR VARIABLE IMPEDANCE

FIELD OF THE INVENTION

The present invention relates generally to electronic circuits and more particularly to a method and apparatus for generating an impedance that is non-linearly variable over a wide impedance range for applications in communications systems.

BACKGROUND

Circuit elements that provide non-linearity can be used as mixers in communications circuits since that non-linearity would produce a quadratic term in a series expansion equivalent of the non-linearity. Mixers that multiply signals are commonly used in communications systems to provide frequency-shifting. Multiplication of a first signal having a first frequency with a second signal having a second frequency generates an output signal having sum and difference frequency components. The sum frequency component of the output signal has a frequency that is the sum of the first and second frequencies, and the difference frequency component of the output signal has a frequency which is the difference of the first and second frequencies.

In communications systems, a (Radio Frequency) RF signal which is the transmitted and received signal in such systems, has a baseband signal modulated on a carrier frequency signal. Because the carrier frequency is a relatively high frequency signal, the RF signal is shifted down to a lower intermediate frequency upon reception and before further processing by mixing the RF signal with a (Local Oscillator) LO signal having a local oscillator frequency. That mixing results in a sum frequency component and a difference frequency component. Typically, filtering is applied to pass only the difference frequency component which is of lower frequency since that signal has a frequency that is the difference of the carrier frequency and the local oscillator frequency. The difference frequency component is called an Intermediate Frequency (IF) signal and is the signal that is further processed by the communications system after reception of the RF signal.

A common prior art device used as a mixer is a back-biased diode whose junction depletion capacitance is a non-linear function of a voltage applied across the diode. Because the resulting capacitance has a low range of variation, this device can provide only a narrow dynamic range of modulation. In addition, such a mixing device has a relatively high noise figure and a low conversion gain (the IF signal power over the RF signal power).

The non-linearity in the voltage-current relations of a Bipolar Junction Transistor (BJT) and a Field Effect Transistor (FET) have also been used to provide mixing. However, FET mixers provide relatively low conversion gain, and although the BJT mixer provides relatively higher conversion gain, the exponential current voltage relationship can result in higher distortions.

OBJECTS OF THE INVENTION

An object of the present invention is to produce an impedance that is a non-linear function of a signal over a wide impedance range.

A further object of the present invention is to employ such a wide impedance range to generate parametric amplification that can result in high order harmonics of a source signal having a fundamental frequency.

Another object of the present invention is to employ such a non-linear variable impedance as a mixing function to frequency shift an initial signal having an initial frequency to result in a frequency-shifted signal having a shifted frequency.

A related object of the present invention is to produce a high conversion gain simultaneously with the frequency shifting.

A further related object of the present invention is to separate out an amplified version of the initial signal that results from the mixing function.

Another related object of the present invention is to separate out the resulting frequency shifted signal from other frequency component signals that result from the mixing.

An additional related object of the present invention is to employ such a mixing function twice to separate out the resulting frequency-shifted signal from other frequency component signals that result from the first mixing via the second mixing. Accordingly, the present invention seeks to achieve such generation and separation of the frequency-shifted signal with the use of circuit elements that can be readily fabricated on-chip within a monolithic integrated circuit.

SUMMARY

In a principle aspect, the present invention takes the form of a method for generating an impedance comprising a resistance and a reactance that are non-linear functions of a signal for a wide impedance range. In accordance with the invention, an electronic component, having a gain-frequency characteristic with a unity gain frequency that is responsive to a component current flowing through the electronic component, is properly configured to generate such an impedance at a first terminal of the electronic component and with respect to a reference voltage source. The component current is comprised of a DC current and a small signal current which is responsive to the signal that non-linearly varies the impedance. Moreover, that signal is applied at the first terminal of the electronic component. A reactive component is operatively connected between a second terminal of the electronic component and the reference voltage source for also determining the non-linearly variable reactance.

The electronic component may advantageously take the form of a BJT having a Beta current-gain frequency characteristic or a programmable operational amplifier having a frequency response gain characteristic. The reactive component may advantageouly take the form of a capacitor such that the generated reactance is a non-linearly variable capacitance or an inductor such that the generated reactance is a non-linearly variable inductance.

The principles of the present invention may be applied to particular advantage when used in combination with a signal source to generate high-order harmonics of a source signal. The signal source is operatively connected to the first terminal of the electronic component and provides the source signal, having a fundamental frequency, to that terminal. Because of the wide impedance range of the non-linear variable impedance generated at the first terminal with respect to a reference voltage source, a negative effective resistance and a near-infinite capacitance can be generated when the source signal is at a firing voltage point. At that voltage point, parametric amplification leads to a higher DC current flowing through the electronic component which causes a rapid change in the time-domain output signal which in turn results in high frequency harmonic signals comprised of harmonic frequencies that are integer multiples of the fundamental frequency.

Alternatively, the non-linearity produced by the present invention may be applied to particular advantage also when used for a mixing function. In that embodiment, the resistive component of the non-linear variable impedance is canceled out to result in a purely reactive mixer for superior system performance. The resistive component is canceled out by operatively connecting a resistor having a predetermined resistance to the second terminal of the electronic component.

In such a mixer, a superposition of a first signal having a first frequency and a second signal having a second frequency is inputted by the electronic component. At an output terminal of the mixer, a mixed signal is generated and is comprised of a third signal having a third frequency that is a difference of the first frequency and the second frequency, and having a gain factor that is the unity gain frequency divided by said third frequency. Because of this gain factor, the third frequency component predominates and further modulates the first signal at the output terminal.

In another aspect of the present invention, this further modulation can be advantageously employed in combination with a bandpass filter tuned to the second frequency to generate an amplified version of the second signal with the gain factor of the third signal as part of the total gain in the amplified version. The filter is operatively connected in series with a resistor at the output terminal of the present invention mixer.

Alternatively, the mixer of the present invention may be applied to particular advantage when used in combination with a filter tuned to the third frequency. In this alternative embodiment of the present invention, the filter is operatively connected to the output terminal, and the modulation of the third signal on the first signal is substantially eliminated.

In yet another aspect of the present invention, the mixer may be applied to particular advantage within a homodyne circuit having two stages of such a mixer. Each of the two stages includes a respective electronic component configured as a reactive mixer. The first stage mixes the first signal with the second signal to result in a mixed signal comprising a third signal modulating the first signal, as described for the mixer of the present invention. The second stage mixer further mixes the mixed signal with the first signal to result in the third signal without the modulation on the first signal.

These and other features and advantages of the present invention will be better understood by considering the following detailed description of the invention which is presented with the attached drawing.

DETAILED DESCRIPTION OF THE PREFERRED EMBODIMENT

Figure 1:
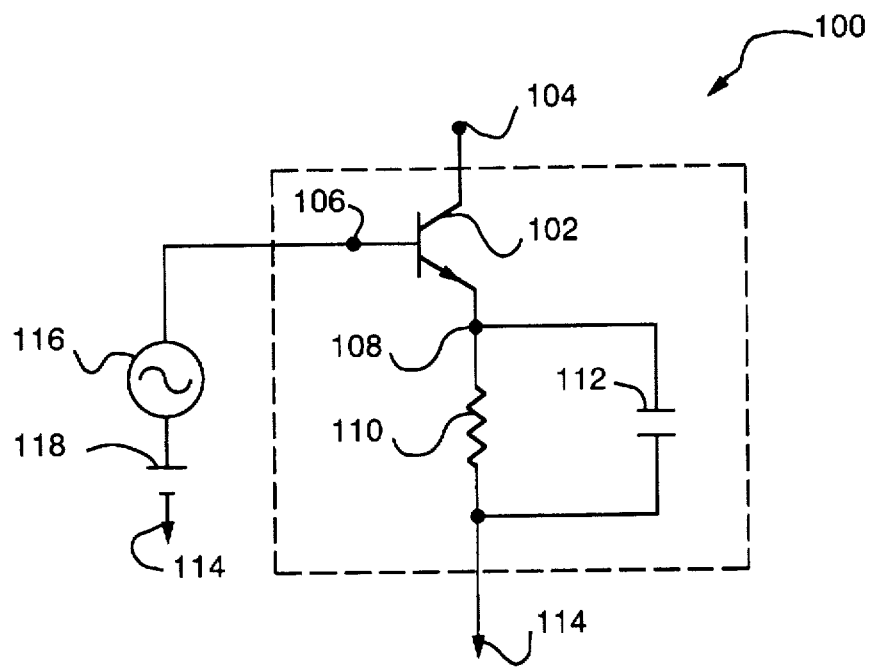
FIG. 1 shows a transistor implementation for generating a non-linear variable impedance comprising a resistance and a capacitance.

FIG. 1 shows an impedance generating device 100 (shown within dashed lines) implemented with a Bipolar Junction Transistor (BJT) 102. The BJT has a collector terminal 104, a base terminal 106, and an emitter terminal 108. A resistor 110 and a capacitor 112 are operatively connected between the emitter terminal and a reference voltage source 114. A small signal source 116 and a DC source 118 are operatively connected to the base terminal.

For high frequencies, the BJT 102 has a beta ($\beta$) current gain characteristic that varies with frequency, as $\beta=(-j\omega_T)/\omega)$, where $\omega$ is the frequency in radians per second and $\omega_T$ is the unity gain frequency of the $\beta$-characteristic. When $\omega=\omega_T$, the magnitude of the $\beta$-gain is unity. The unity gain frequency $\omega_T$ varies with a component current which includes a DC current, determined by the DC source 118, and a small signal current $i_e$, determined by the small signal source 116, flowing through the BJT, as $\omega_T=\omega_o+2\pi k i_e$. k is a slope constant that depends on the fabrication design parameters of the BJT. $\omega_o$ is the initial unity-gain frequency and is directly proportional to the DC operating current flowing through the BJT. An example BJT that has these characteristics and that can be used to implement the present invention is the MRF941 from Motorola, Inc., Schaumberg, Ill.

The impedance generated by the device 100 is the effective impedance looking into the base terminal 106 (and with respect to the reference voltage source 114). That impedance, $Z_{in}=(1+\beta)Z_e$, where $\beta$ is the current gain of the BJT and $Z_e$ is the impedance at the emitter terminal (and with respect to the reference voltage source 114). In the impedance generating device 100, $Z_e$ is the resistor 110 in parallel connection with the capacitor 112. The small signal current $i_e=(1+\beta)i_b$, where $i_b$ is the small signal base current of the BJT. Since $i_b=V_{in}/Z_{in}$, where $V_{in}$ is the voltage applied at the base terminal, $i_e=V_{in}/Z_e$, and the small signal current $i_e$ is directly proportional to $V_{in}$.

From the relations, $Z_{in}=(1+\beta)Z_e$, $\beta=(-j\omega_T)/\omega$, $\omega_T=\omega_o+2\pi k i_e$, and $i_e=V_{in}/Z_e$, mathematical derivation can show that $Z_{in}$ has two components. A first component is a real number term which is a non-linear function of $V_{in}$ and represents an effective non-linear variable resistance. A second component is an imaginary number term which is a non-linearfunction of $V_{in}$ and represents an effective non-linear variable capacitance.

If the resistor 110 has a resistance value $R_o$ and the capacitor 112 has a capacitance value $C_o$, such that $1/(R_oC_o)=\omega_o$ of the BJT 102 with a given DC operating current, then the real number term cancels out, and only the non-linear variable capacitance remains at the base terminal (with respect to the reference voltage source 114). In applications of the device 100 within mixers, this condition leads to superior system performance. If the real number term were existent and negative, then positive feedback may lead to instability of the system. If the real number term were existent and positive, this resistance would introduce additional noise to the system.

Designing $1/(R_oC_o)=\omega_o$ eliminates the resistive real number component and $Z_{in}$ has only an effective capacitive component $C_{eff}$ as follows:

$$C_{ef}=C_o/(1+2\pi k V_{in} C_0),$$

where $V_{in}$ is the voltage applied at the base terminal 106. The non-linear variable capacitive function for $C_{ef}$ as a function of voltage is in the form $1/(1+x)$, where x includes the voltage signal $V_{in}$. This non-linear function can be expanded into a power series form $1-x+x^2-x^3+\ldots$, and the quadratic term $x^2$ provides the mixing of two signals. In this manner, the device 100 with the relation for $C_{ef}$ provides a purely capacitive mixer.

An impedance generating device that provides the non-linear variable impedance can be implemented alternatively with any other electronic component having a gain-frequency characteristic with a unity gain frequency that depends proportionately on the voltage that non-linearly varies the impedance. For example, in FIG. 2, such an impedance generating device 200 is implemented with a programmable operational amplifier 202.

This operational amplifier is connected in a unity-gain configuration with a negative input terminal 204 of the operational amplifier being operatively connected to an output terminal 206 of the operational amplifier. A positive input terminal 208 of the operational amplifier provides the impedance that is a non-linear function of the voltage applied at that terminal. A resistor 210 and a capacitor 212 are connected in parallel between the output terminal and the positive input terminal.

The programmable operational amplifier 202 has a gain frequency response with a unity gain frequency which is programmable by setting a current flowing through a programmable terminal 214 of the operational amplifier. This current can be set with a bias resistor 216 in parallel connection with a bias capacitor 218 operatively connected between the programmable terminal and a bias terminal 220. A small signal source 222 and a DC source 224 are operatively connected between that bias terminal and a reference voltage source 226 and determine a small signal current and a DC current respectively that flow through the programmable terminal.

If the bias terminal 220 were operatively connected to the positive input terminal 208, then the current through the programmable terminal 214 and in turn the unity gain frequency of the operational amplifier is directly proportional to the input voltage at the positive input terminal. With this direct proportionality, the effective impedance looking into the positive input terminal (with respect to the reference voltage source 226) is similar to that generated by the device 100 of FIG. 1. A resistive component and a capacitive component that are non-linear functions of voltage can be mathematically derived similarly to that for the BJT implementation in FIG. 1.

Figure 2:
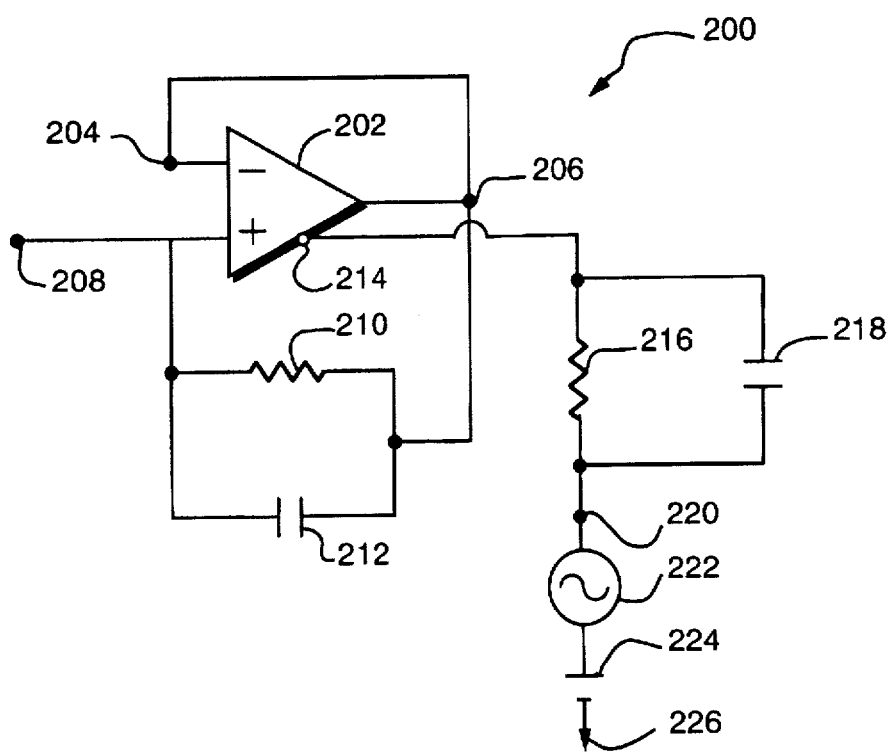
FIG. 2 shows an operational amplifier implementation for generating a non-linear variable impedance comprising a resistance and a capacitance.
Figure 3:
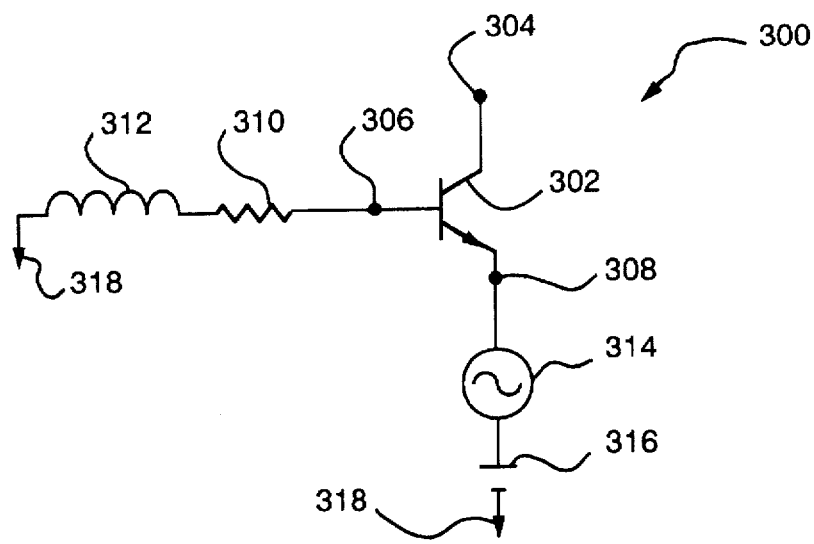
FIG. 3 shows a transistor implementation for generating a non-linear variable impedance comprising a resistance and an inductance.

The non-linear variable impedances generated by the impedance generating devices in FIGS. 1 and 2 have included a capacitance that is a non-linear function of voltage. Alternatively, an impedance generating device 300 in FIG. 3 provides a non-linear variable inductance.

This impedance generating device 300 includes a Bipolar Junction Transistor (BJT) 302 with a collector terminal 304, a base terminal 306, and an emitter terminal 308. A resistor 310 and an inductor 312 are operatively connected to the base terminal, and a small signal source 314 and a DC source 316 are operatively connected between the emitter terminal and a reference voltage source 318.

The BJT has a beta ($\beta$) current gain characteristic that varies with frequency, as $\beta=(-j\omega_T)/\omega$, where $\omega$ is the frequency in radians per second and $\omega_T$ is the unity gain frequency of the $\beta$-characteristic of the BJT 302. $\omega_T=\omega_o+2\pi k i_e$, where k is a slope constant that depends on the fabrication design parameters of the BJT. $i_e$ is the small signal current determined by the small signal source, and $\omega_o$ is the initial unity-gain frequency that is directly proportional to the DC operating current, determined by the DC source, flowing through the BJT. With mathematical derivations similar to that for the impedance generating device of FIG. 1, the effective impedance $Z_{in}$ looking into the emitter terminal 308 in the BJT (and with respect to the reference voltage source 318) is a resistance and an inductance that are non-linear functions of a voltage applied at that terminal.

Figure 4A:
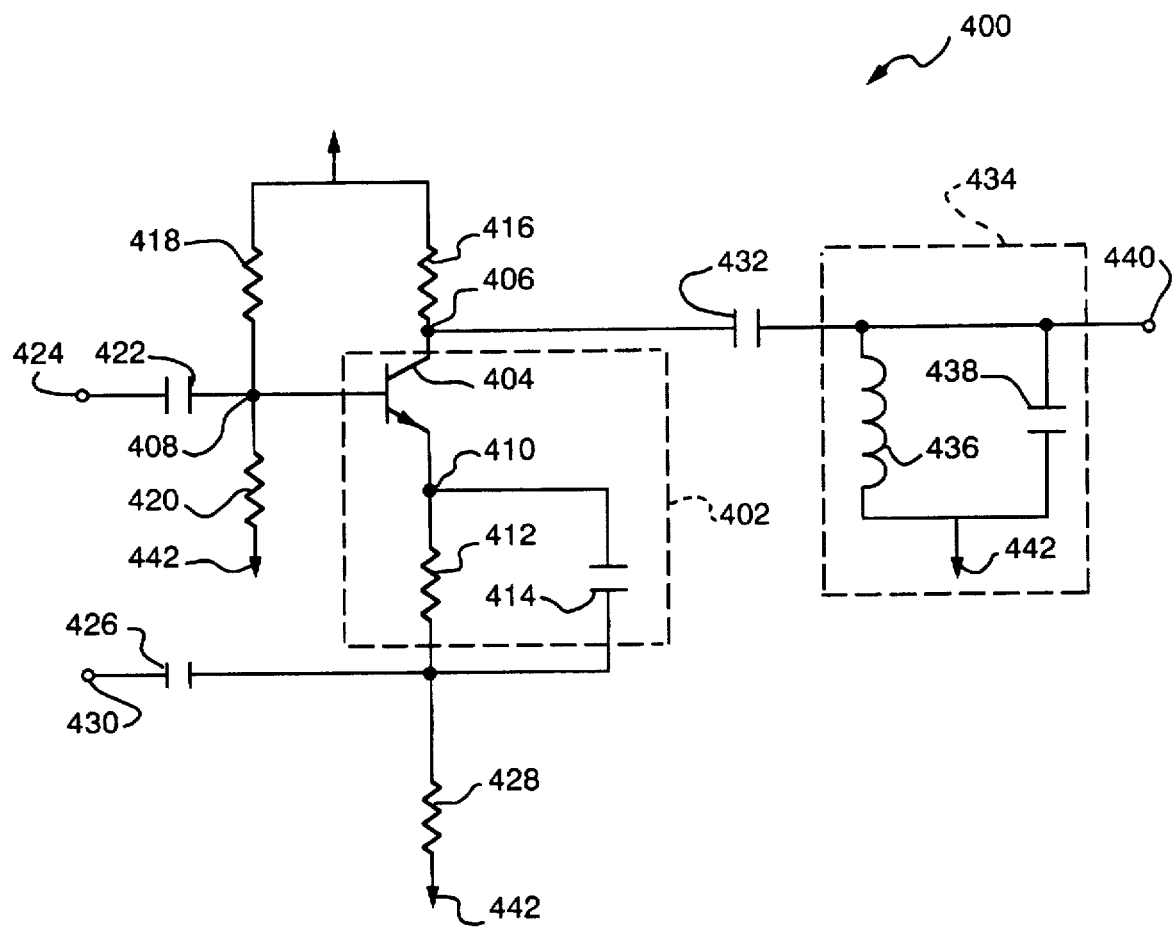
FIG. 4a shows a mixer circuit for generating an IF component signal, from an RF signal and an LO signal, employing the impedance generating device of FIG. 1.

Communications circuits can employ these impedance generating devices. For example, FIG. 4a shows a mixer 400 employing an impedance generating device 402 that is similar to that in FIG. 1. That device includes a Bipolar Junction Transistor (BJT) 404 having a collector terminal 406, a base terminal 408, and an emitter terminal 410. A resistor 412 and a capacitor 414 are also operatively connected to the emitter terminal of that BJT.

The mixer circuit 400 also includes a collector resistor 416 operatively connected to the collector terminal 406, and a first base bias resistor 418 and a second base bias resistor 420 operatively connected to the base terminal 408, for determining the DC current flowing through the BJT 404. A first input coupling capacitor 422 operatively couples a first input signal at a first input terminal 424. A second input coupling capacitor 426 and a second input coupling resistor 428 operatively couple a second input signal at a second input terminal 430. An output coupling capacitor 432 operatively couples the signal at the collector terminal 406 to a tuned Intermediate Frequency (IF) filter 434 (shown in dashed lines) which consists of an inductor 436 and a capacitor 438. The output signal is provided at the output terminal 440 with respect to a reference voltage source 442.

The operation of the mixer circuit 400 is now described. The impedance generating device 402 has been designed to provide the following purely capacitive non-linear function of voltage:

$$C_{ef}=C_o/(1+2\pi k V_{in} C_0),$$

where $C_o$ is the capacitance value of the capacitor 414 and $V_{in}$ is the voltage at the base terminal 408. Since $C_{ef}$ as a function of voltage has a functional form $1/(1+x)$, where x includes the voltage signal $V_{in}$, this function can be expressed as a power series expansion, $1-x^1 x^3+\ldots$. The quadratic term $x^2$ provides the multiplication function and thus the mixing as well. A first input signal having a first frequency applied at the first input terminal 424 is mixed with a second input signal having a second frequency applied at the second input terminal 430, by the impedance generating device 402.

In a communications circuit, assume that a Radio Frequency (RF) signal, having a carrier frequency $\omega_{RF}$ and having a signal function $S_{RF}=V_{RF}\cos(\omega_{RF}t)$, is coupled to the first input terminal 424. Assume also that a Local Oscillator (LO) signal, having a local oscillator frequency $\omega_{LO}$ and having a signal function $S_{LO}=V_{LO}\cos(\omega_{LO}t)$, is coupled to the second input terminal 430. The capacitive mixing provided by the impedance generating device 402 results in a multiplication of these signals as follows:

$$=V_{LO}V_{RF}\cos(\omega_{RF}t)*\cos(\omega_{LO}t),$$

which by trigonometric identity, $$=(\tfrac{1}{2})V_{LO}V_{RF}[\cos((\omega_{LO}+\omega_{RF})t)+\cos((\omega_{LO}+\omega_{RF})t)].$$

The mixing results in a sum frequency component and a difference frequency component. The sum frequency component has a signal function $(\frac{1}{2})v_{LO}v_{RF}\cos((\omega_{LO}+\omega_{RF})t)$ and has a frequency $\omega_{LO}+\omega_{RF}$. The difference frequency component has a signal function $(\frac{1}{2})v_{LO}v_{RF}\cos((\omega_{LO}-\omega_{RF})t)$ and has a frequency $\omega_{LO}-\omega_{RF}$.

In communications circuits, the difference frequency component is of main concern since the RF signal upon reception typically is frequency shifted down to the Intermediate Frequency (IF) $\omega_{IF}=\omega_{RF}$. Thus, the difference frequency component from the mixing is the IF signal of interest.

The base current $i_b$ that corresponds to the IF signal that results from the mixing is as follows:

$$i_b=(\frac{1}{2})i_{LO}i_{RF}\cos((\omega_{LO}-\omega_{RF})t),$$

where $i_{LO}$ and $i_{RF}$ are the respective current magnitudes of the $v_{LO}$ and $v_{RF}$ voltage magnitudes. The collector current $i_c$ for the IF signal is beta, $\beta=(-j\omega_T)/\omega$, times the base current at the IF frequency, as follows:

$$i_c=[(-j\omega_T/(\omega_{LO}-\omega_{RF})]*(\frac{1}{2})i_{LO}i_{RF}\cos((\omega_{LO}-\omega_{RF})t).$$

Note that the IF component has a gain factor of $(\omega_T)/(\omega_{RF})$. Because of the frequency shifting down to the IF frequency, the IF component has an higher amplification product of $(\omega_T)/(\omega_{LO}-\omega_{RF})$, in the collector.

The sum frequency component and the difference frequency component that results from the mixing by the impedance generating device 402 would result at the collector terminal 406. Because the non-linearity provided by the impedance generating device 402 is in the form $1/(1+x)$ which can be expanded to the power series $1-x+x^2-x^3+\ldots$, the higher order terms aside from the quadratic $x^2$ term can lead to other frequency components aside from just the sum and difference components at the collector terminal 406. In addition, since the RF signal $S_{RF}$ and the LO signal $S_{LO}$ are super-imposed as $S_{RF}+S_{LO}$, the quadratic $x^2$ term in the power series expansion provides the terms $(S_{RF}+S_{LO})^2=S_{RF}^2+2S_{RF}S_{LO}+S_{LO}^2$. The term $2S_{RF}S_{LO}$ provides the mixing, but the terms $S_{RF}^2$ and $S_{LO}^2$ also provide other frequency components aside from just the sum and difference frequency components from the mixing.

Thus, the IF bandpass filter 434, tuned to the IF frequency $\omega_{IF}=\omega_{LO}-\omega_{RF}$, is provided to selectively pass through the IF frequency to the output terminal 440. Even if the IF filter 434 were not provided however, the IF frequency component still predominates over the other frequency components because of the additional amplification product of $(\omega_T/\omega_{IF})$ at this lower IF frequency. Without the filter, the predominant amplified IF component modulates the LO signal at the collector terminal 406. Coupling the IF filter 434 to the collector terminal substantially eliminates this modulation and generates the IF signal at the output terminal 440.

Figure 4B:
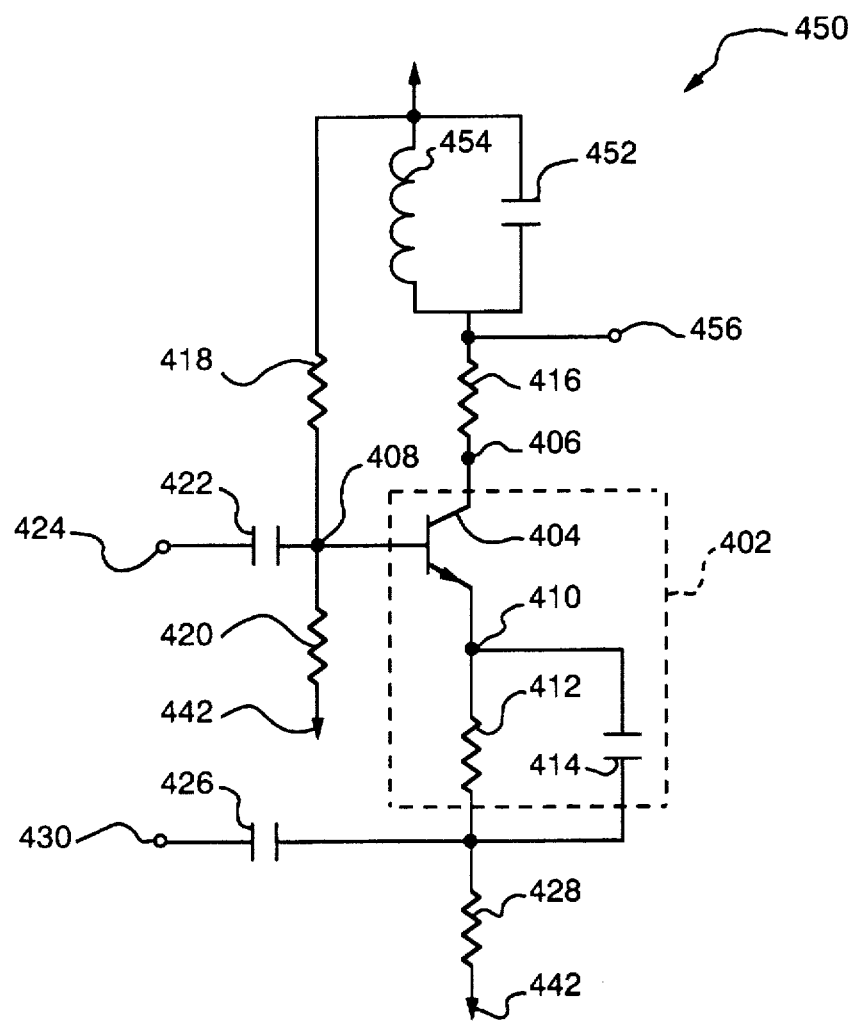
FIG. 4b shows a mixer circuit for generating an amplified RF signal, employing the impedance generating device of FIG. 1.

Alternatively, with the predominant amplified IF component modulating the LO signal, the impedance generating device can be used for amplifying the RF signal. FIG. 4b shows such a circuit 450 for implementing a RF amplifier. The circuit elements in the RF amplifier circuit that have the same numbered reference as that in FIG. 4a serve the same function as the corresponding element in FIG. 4a.

The RF amplifier circuit 450 however does not include the IF filter 434 of FIG. 4a. Instead, a tank circuit comprised of a parallel connection of a capacitor 452 and an inductor 454 are serially connected from the collector resistor 416. This tank circuit is tuned to the RF frequency. The output 456 of this circuit is between the series connection of the tank circuit and the collector resistor.

The operation of the RF amplifier 450 is now described. Just as for the mixer circuit 400 of FIG. 4a, if a RF frequency signal, having a carrier frequency $\omega_{RF}$, is coupled to the first input terminal 424, and a LO signal, having a local oscillator frequency $\omega_{LO}$, is coupled to the second input terminal 430, an IF signal having an intermediate frequency, $\omega_{IF}=\omega_{LO}-\omega_{RF}$, is generated at the collector terminal 406 of the impedance generating device 402. This IF component signal has a gain factor of $(\omega_T/\omega_{IF})$, and if the tank circuit were not operatively connected to the collector resistor 416, the IF signal would modulate the LO signal.

Because of this modulation, the RF signal is regenerated. The IF signal has a frequency $\omega_{IF}=\omega_{LO}-\omega_{RF}$, and the modulation of this signal on the LO signal results in a difference frequency component $\omega_m=\omega_{LO}-\omega_{IF}=\omega_{LO}-(\omega_{LO}-\omega_{RF})=\omega_{RF}$. With the tank circuit in FIG. 4b being tuned to the RF frequency, the $\omega_{RF}$ component is selectively filtered, and the RF component is provided at the output 456. Moreover, because of the gain factor $(\omega_T/\omega_{IF})$ of the IF component signal provided by the impedance generating device 402, the RF component at the output also has that gain factor. Essentially, the RF amplifier circuit 450 provides a gain factor of $(\omega_T/\omega_{IF})$ to the RF signal provided at the first input terminal 424. (Note that the total gain provided by the RF amplifier is determined among others by that gain factor and values of the collector resistor 416, the tank circuit capacitor 452, and the tank circuit inductor 454).

Figure 5:
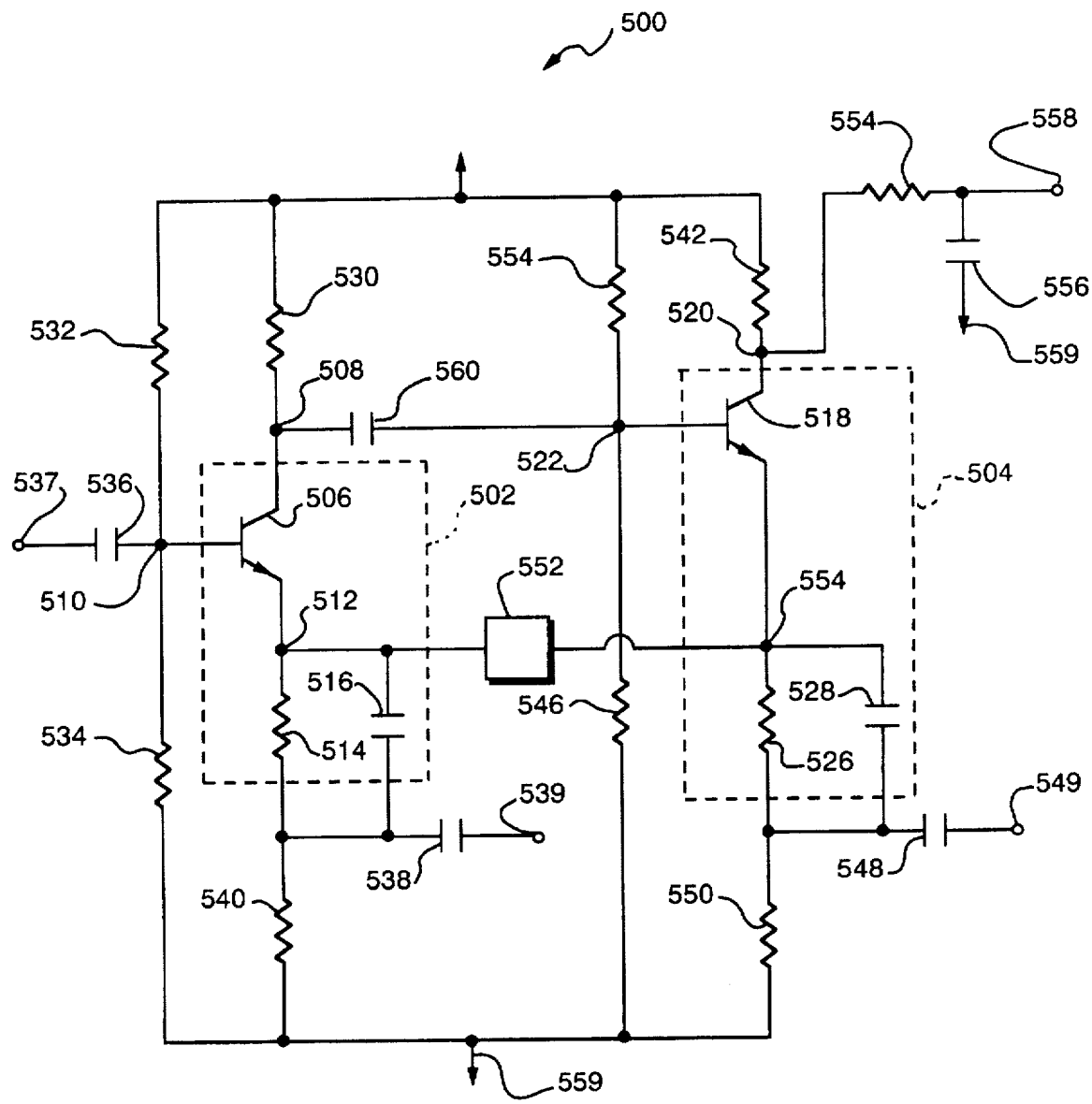
FIG. 5 shows a homodyne circuit employing the impedance generating device of FIG. 1.

Another circuit that can separate out the IF component after mixing a RF signal with a LO signal is a homodyne circuit 500 of FIG. 5. This circuit includes a first impedance generating device 502 and a second impedance generating device 504 that are similar to the impedance generating device of FIG. 1.

The first impedance generating device 502 includes a first Bipolar Junction Transistor (BJT) 506 having a first collector terminal 508, a first base terminal 510, and a first emitter terminal 512. This device also includes a first impedance generating resistor 514 and a first impedance generating capacitor 516 operatively connected to the first emitter terminal. The resistance value of this first impedance generating resistor and the capacitance value of this first impedance generating capacitor are designed such that the first impedance generating device is a purely capacitive mixer for optimum system performance.

The second impedance generating device 504 includes a second Bipolar Junction Transistor (BJT) 518 having a second collector terminal 520, a second base terminal 522, and a second emitter terminal 524. This device also includes a second impedance generating resistor 526 and a second impedance generating capacitor 528 operatively connected to the second emitter terminal. The resistance value of this second impedance generating resistor and the capacitance value of this second impedance generating capacitor are designed such that the second impedance generating device is a purely capacitive mixer for optimum system performance.

The homodyne circuit 500 provides two stages of mixing. The first mixing stage which includes the first impedance generating device 502 also includes a first collector resistor 530 operatively connected to the first collector terminal 508. A first base bias resistor 532 and a second base bias resistor 534 are operatively connected to the first base terminal 510, for determining the DC current flowing through the first BJT 506. A RF coupling capacitor 536 is also operatively connected to the first base terminal to couple a RF signal at a RF input terminal 537 to this device. A first LO coupling capacitor 538 and a first LO coupling resistor 540 are operatively connected to the first impedance generating device 502 to couple a LO signal at the first LO input terminal 539 to this device.

The second mixing stage which includes the second impedance generating device 504 also includes a second collector resistor 542 operatively connected to the second collector terminal 520. A third base bias resistor 544 and a fourth base bias resistor 546 are operatively connected to the second base terminal 522, for determining the DC current flowing through the second BJT 518. A second LO coupling capacitor 548 and a second LO coupling resistor 550 are operatively connected to the second impedance generating device to couple the LO signal at a second LO input terminal 549 to this device.

A feedback impedance network 552 which typically would include a resistor and a capacitor in series is operatively connected between the first emitter terminal 512 and the second emitter terminal 524 to provide feedback. Also a low pass filter, which includes a filter resistor 554 and a filter capacitor 556, is operatively connected to the second collector terminal 520 to provide an output at the output terminal 558 with respect to a reference voltage source 559. An inter-stage coupling capacitor 560 couples a signal at the first collector terminal 508 to the second base terminal 522.

The operation of the homodyne circuit 500 is now described. The first impedance generating device 502 which acts as a first capacitive mixer inputs a RF signal $S_{RF}=v_{RF}\cos(\omega_{RF}t)$ at the first base terminal 510 of the first BJT 506 and a LO signal $S_{LO}=v_{LO}\cos(\omega_{LO}t)$ at the first emitter terminal 512 of the first BJT. As a result of the capacitive mixing within this first impedance generating device 502, a predominant IF component with the additional $\beta$ gain of $(\omega_T)/(\omega_{LO}-\omega_{RF})$ at the IF modulates the LO signal, where $\omega_T$ is the unity gain frequency of the BJT 506. The resulting first mixed signal $S_{m1}$, at the first collector terminal 508 is as follows:

$$S_{m1}=\cos(\omega_{IF}t)*\cos(\omega_{LO}t),$$

where the amplitude factors of $v_{RF}$ and $v_{LO}$ have been omitted for sake of simplified illustration.

The inter-stage coupling capacitor 560 couples this first mixed signal $S_{m1}$ from the first collector terminal 508 to the second base terminal 522 of the second impedance generating device 504. This device acts as another purely capacitive mixer, and multiplies the first mixed signal $S_{m1}$ with the LO signal $S_{LO}=v_{LO}\cos(\omega_{LO}t)$ coupled to this device from the second LO signal input terminal 549. The resulting second mixed signal $S_{m2}$ at the second collector terminal 520 is as follows:

$$S_{m2}=\cos(\omega_{IF}t)*\cos(\omega_{LO}t)*\cos(\omega_{LO}t)=\cos(\omega_{IF}t)*\cos^2(\omega_{LO}t),$$

where the amplitude factors of $v_{RF}$ and $v_{LO}$ have been omitted for sake of simplified illustration. By the trigonometric identity $\cos^2(\omega_{LO}t)=(\tfrac{1}{2})(1+\cos(2\omega_{LO}t))$, $S_{m2}$ can be expressed as follows:

$$S_{m2}=\cos(\omega_{IF}t)*(\tfrac{1}{2})(1+\cos(2\omega_{LO}t)) =(\tfrac{1}{2})\cos(\omega_{IF}t)*\cos(2\omega_{LO}t).$$

Note that an IF component (as shown by the boldened term in the expression for $S_{m2}$) has been generated at the second collector terminal 520 of the homodyne circuit 500. The low pass filter, which includes the low pass resistor 554 and the low pass capacitor 556, passes through only the lower frequency IF component to the output terminal 558.

In this manner, the homodyne circuit 500 has frequency shifted the RF signal provided at the RF input terminal 537 to an IF frequency signal by using two stages of mixing with two impedance generating devices designed as purely capacitive mixers. The IF signal is generated without the use of a tuned IF filter as required in the mixer of FIG. 4a. In addition, the feedback network 552 within the homodyne circuit 500 provides feedback to sharpen the Q-factor of the system frequency response of this circuit at the IF frequency $\omega_{IF}=\omega_{LO}-\omega_{RF}$. A Q-factor as high as 50 can be achieved.

This Q-factor is difficult to achieve with a tuned IF filter, and this homodyne circuit provides high gain and selectivity at the IF without the use of an IF filter. Moreover, an external Surface Acoustic Wave (SAW) resonator or any other external high Q-circuit, which can be costly, is not required in order to generate a detectable IF signal. Furthermore, the homodyne circuit provides built-in synchronization detection at the IF frequency without the use of phase detectors typically required for such detection.

The homodyne circuit 500 is also advantageous since no inductors within a tuned IF filter are required. Inductors are difficult to implement on-chip within a monolithic integrated circuit, and typically must be connected off-chip. This requirement can add to the labor and cost of manufacturing circuits with off-chip inductors. In contrast, the homodyne circuit 500 according to the present invention is implemented with only circuit elements such as transistors, resistors, and capacitors that are easily fabricated on-chip within a monolithic integrated circuit.

Figure 6:
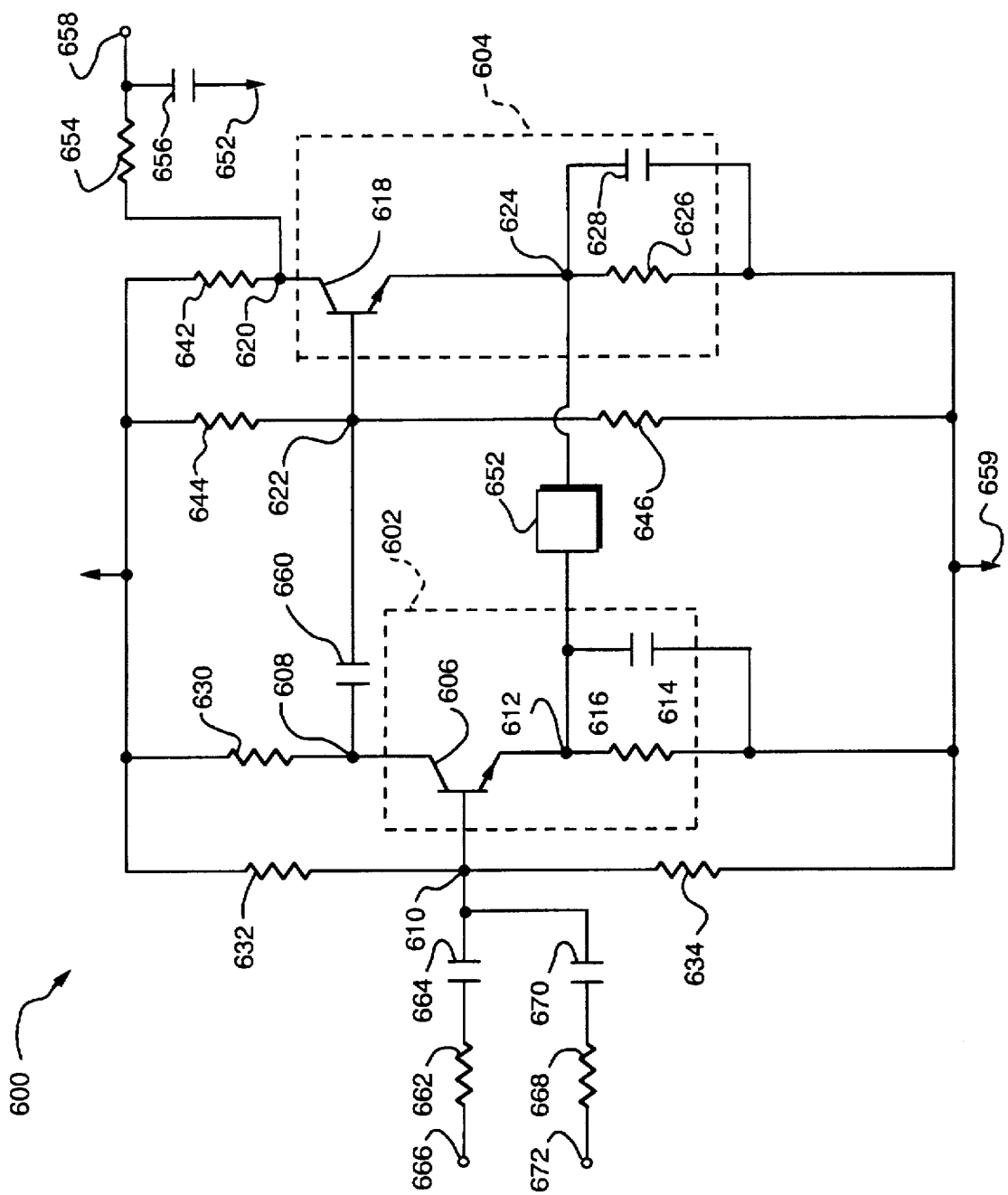
FIG. 6 shows an alternative homodyne circuit employing the impedance generating device of FIG. 1.

FIG. 6 shows another embodiment 600 for implementing a homodyne circuit. The circuit elements in this circuit are similar to those of the homodyne circuit 500 of FIG. 5. The homodyne circuit 600 of FIG. 6 also provides two stages of mixing with a first impedance generating device 602 and a second impedance generating device 604 that are designed as purely capacitive mixers, and an IF frequency signal is generated at the output terminal 658.

However, the homodyne circuit 600 of FIG. 6 couples both the RF signal and the LO signal to the first base terminal 610 of the BJT 606 within the first impedance generating device 602. A RF coupling resistor 662 and a RF coupling capacitor 664 couples a RF signal at a RF input terminal 666 to the first base terminal. Similarly, a LO coupling resistor 668 and a LO coupling capacitor 670 couples a LO signal at a LO input terminal 672.

The embodiment 600 of the homodyne circuit illustrates an alternative technique for providing a superposition of the RF signal $S_{RF}=v_{RF}\cos(\omega_{RF}t)$ and the LO signal $S_{LO}=v_{LO}\cos(\omega_{LO}t)$, from the embodiment 500 of FIG. 5. As long as the quadratic term $x^2$ in the power series expansion equivalent of the non-linear impedance function $1/(1+x)$ provided by the mixing devices 502, 504, 602, and 604 have a superposition of the RF and LO signals such that $x=(S_{RF}+S_{LO})$, $x^2=(S_{RF}+S_{LO})^2$ will provide an IF component term. This superposition can be accomplished by coupling the RF signal and the LO signal as shown in either embodiment 500 of FIG. 5 or embodiment 600 of FIG. 6.

Figure 7:
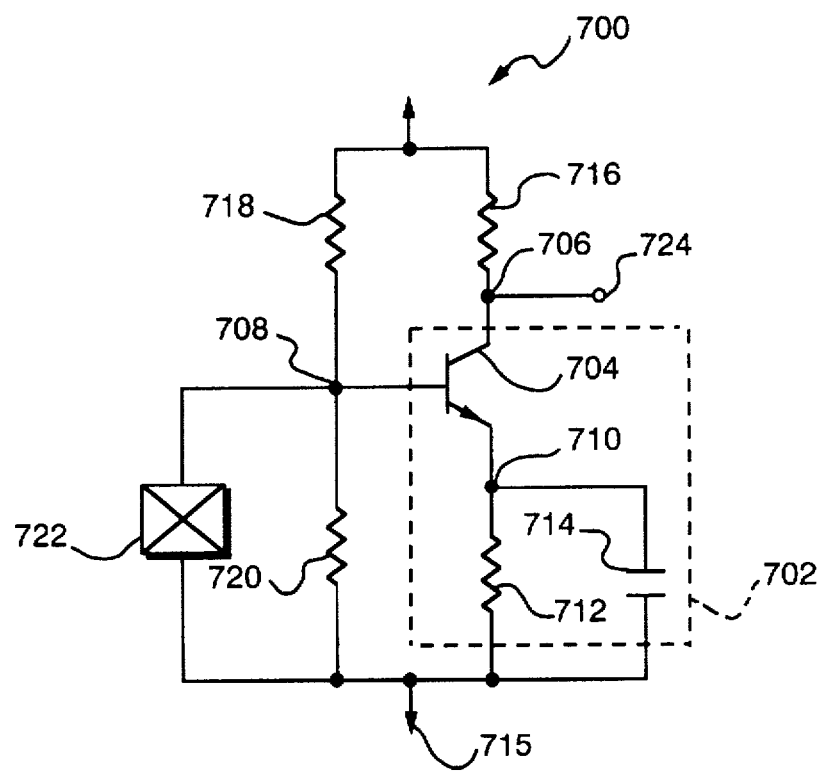
FIG. 7 shows a high frequency harmonic generator employing the impedance generating device of FIG. 1.

Because the impedance generating device of the present invention provides a non-linear variable impedance over a wide impedance range, such a device is also amenable for implementing a high frequency harmonic generator. FIG. 7 shows such a harmonic generator 700 employing an impedance generating device 702 similar to that of FIG. 1.

The impedance generating device 702 includes a Bipolar Junction Transistor (BJT) 704 having a collector terminal 706, a base terminal 708, and an emitter terminal 710. This device also includes an impedance generating resistor 712 and an impedance generating capacitor 714 operatively connected between the emitter terminal and a reference voltage source 715.

The harmonic generator circuit also includes a collector load resistor 716 operatively connected to the collector terminal 706, and a first base bias resistor 718 and a second base bias resistor 720 operatively connected to the base terminal 708, for determining the DC current flowing through the BJT 704. A signal source 722, which for example may be an oscillator, is operatively connected to the base terminal. The output terminal 724 of this circuit is the collector terminal.

The operation of the high frequency harmonic generator 700 is now described. For the BJT 704, the current gain ($\beta$) characteristic is $\beta=(-j\omega_T)/\omega$, where $\omega_T$, the unity gain frequency of this characteristic has the relation, $\omega_T=\omega_o+2\pi k i_e$. k is a slope constant that depends on fabrication design parameters. $i_e$ is the small signal current determined by a small signal at the base terminal, and $\omega_o$ is initial unity gain frequency determined by the DC current flowing through the BJT 704. If $Z_{in}$ is the effective impedance looking into the base terminal 708 (with respect to the reference voltage source 715), then $Z_{in}=(1+\beta)Z_e=[1+(j\omega_T)/\omega]Z_e$, where $Z_e$, is the effective impedance operatively connected between the emitter terminal 710 and the reference voltage source 715.

If the capacitance value C of the impedance generating capacitor 714 and the resistance value R of the impedance generating resistor 712 were selected with R and C being substantially large such that $R>>1/(j\omega C)$, then the capacitive reactance $1/(j\omega C)$ would predominate over the resistance R in the parallel connection of the impedance generating capacitor and the impedance generating resistor, and $Z_e \approx 1/(j\omega C)$. In that case, mathematical derivation shows the following relation for $Z_{in}$:

$$Z_{in}=-\omega_o/(\omega^2 C)+(1/(j\omega C))[1+2\pi k VC],$$

where V is the voltage at the base terminal 708 (with respect to the reference voltage source 715). Thus, the effective impedance $Z_{in}$ consists of an effective negative resistance term, $-\omega_o/(\omega^2 C)$, and a variable non-linear capacitance term, with capacitance $C/(1+2\pi k VC)$.

In the harmonic generator 700, the signal source 722 provides a source signal with a fundamental frequency to the base terminal 708. When the source signal hits a firing voltage point where $(1+2\pi k VC)=0$, then $Z_{in}=-\omega_o/(\omega^2 C)$. This negative effective resistance provides positive feedback. The effective capacitance of $Z_{in}$ is $C/(1+2\pi k VC)$, and since $(1+2\pi k VC)=0$ at this firing voltage point, this effective capacitance is near infinite. Thus, the effective capacitor of $Z_{in}$ acts as a short circuit and causes a large current to flow through the BJT 704.

Furthermore, this large current in turn causes an increase in the negative resistive term $-\omega/(\omega^2 C)$ since $\omega_o$ is directly proportional to the current flowing through the BJT 704. A larger effective negative resistance leads to more positive feedback which further increases the current flowing through the BJT. Also, the second harmonic component of the input current at the base terminal 708 is larger than the current signal at the fundamental frequency at that terminal and is phase shifted from this signal by 90°. These conditions by parametric amplification within the non-linear device 702 lead to more regeneration and thus larger positive feedback which further increases the current flowing through the BJT.

With such a large increase in the current flowing through the BJT 704 at the firing voltage point, the output at the collector terminal 706 changes suddenly with a small transition time since a large current can charge up the collector terminal very quickly. This sudden transition in the time domain leads to high frequency harmonic components in the frequency domain. Thus, the high frequency harmonic generator 700 provides high frequency harmonic signals, at the output terminal 724, having frequencies at integer multiples of the fundamental frequency of the source signal.

Because the effective capacitance provided by the impedance generating device 702 according to the present invention has such a wide range, such a device is especially amenable to application within the harmonic generator 700. With possibility of the effective infinite capacitance, the positive feedback effect, and the parametric amplification effect within the impedance generating device 702, large currents can be produced, and harmonics as high as the 30th order of the fundamental frequency can be generated. Consequently, signals with frequencies as high as tens of gigahertz can be generated and this harmonic generator can be used in high frequency communications systems.

The advantages of the invention described herein can be generalized to implementation of non-linear variable impedance generating devices with any electronic component that can be easily fabricated on-chip and that has a gain characteristic with a unity gain frequency that is directly proportional to the signal that varies the non-linear impedance. Accordingly, the foregoing description is by way of example only and is not intended to be limiting. The invention is limited only as defined in the following claims and equivalents thereof.

What is claimed is:

1. A method for generating an impedance, comprising a resistance and a reactance that are a non-linear functions of a signal, the method including in combination, the steps of:

A. receiving said signal at a first terminal of an electronic component having a gain frequency characteristic with a unity gain frequency;

B. generating a component current, through said electronic component, comprised of a DC current and a small signal current that is responsive to said signal, wherein said component current determines said unity gain frequency of said electronic component;

C. operatively connecting a reactive component, having a reactance value that determines said impedance, between a second terminal of said electronic component and a reference voltage source; and D. producing said impedance that is said non-linear function of said signal, at said first terminal of said electronic component and with respect to said reference voltage source.

2. The method of claim 1 wherein, said electronic component is a Bipolar Junction Transistor (BJT) having a Beta current-gain frequency characteristic responsive to said component current flowing through said BJT, and wherein, said first terminal is a base terminal of said BJT, said second terminal is an emitter terminal of said BJT, said reactive component is a capacitor, and said reactance is a non-linear variable capacitance.

3. The method of claim 1 wherein, said electronic component is a Bipolar Junction Transistor (BJT) having a Beta current-gain frequency characteristic responsive to said component current flowing through said BJT, and wherein, said first terminal is an emitter terminal of said BJT, said second terminal is a base terminal of said BJT, said reactive component is an inductor, and said reactance is a non-linear variable inductance.

4. The method of claim 1 wherein, said electronic component is a programmable operational amplifier, in unity gain configuration, having a frequency response gain characteristic responsive to said component current flowing through said operational amplifier, and wherein, said first terminal is a positive input terminal of said operational amplifier, said second terminal is a negative input terminal of said operational amplifier, said reactive component is a capacitor, and said reactance is a non-linear variable capacitance.

5. The method of claim 1, further including in combination, the steps of:

E. operatively coupling a source signal having a fundamental frequency to said first terminal of said electronic component;

F. generating an infinite effective capacitance and a negative effective resistance at said first terminal, which produces parametric amplification, when said source signal is at a firing voltage point, to result in an increase in said DC current flowing through said electronic component; and G. producing high frequency harmonic signals comprised of harmonic frequencies that are integer multiples of said fundamental frequency from said increase in said DC current, at a third terminal of said electronic component.

6. The method of claim 1, further including in combination, the step of:

H. canceling out said resistance by operatively connecting a resistive component, having a predetermined resistance, to said second terminal such that said impedance is substantially a non-linear variable reactance.

7. The method of claim 6, further including in combination, the steps of:

I. receiving a first signal having a first frequency at one of said first and second terminals of said electronic component;

J. receiving a second signal having a second frequency at one of said first and second terminals of said electronic component;

K. mixing said first signal and said second signal at said electronic component; and L. generating a mixed signal comprised of a third signal, having a third frequency that is a difference of said first frequency and said second frequency, and having a gain factor, at said third frequency, that is said unity gain frequency divided by said third frequency, said third signal being modulated on said first signal, at a third terminal of said electronic component.

8. The method of claim 7 wherein, said electronic component is within a communications system and wherein, said first signal is a local oscillator signal, said first frequency is a local oscillator frequency, said second signal is a radio frequency signal, said second frequency is a carrier frequency, said third signal is an intermediate frequency signal, and said third frequency is an intermediate frequency.

9. The method of claim 8, further including in combination, the step of:

M. filtering said mixed signal with an IF filter tuned to said intermediate frequency to selectively pass through said intermediate frequency signal.

10. The method of claim 8, further including in combination, the step of:

N. separating out an amplified radio frequency signal from said modulation of said intermediate frequency signal on said local oscillator signal, said amplified radio frequency signal having said gain factor as part of a total radio frequency gain.

11. The method of claim 7, further including in combination, the steps of:

O. operatively coupling said first signal to a first second-component terminal of a second electronic component;

P. operatively coupling said mixed signal to a second second-component terminal of said second electronic component;

Q. configuring said second electronic component into a reactive mixer to mix said first signal with said mixed signal; and R. producing said third frequency signal without modulation on said first signal from said mixing of said first signal with said mixed signal, at a third second-component terminal of said second electronic component.

12. The method of claim 11 wherein, said electronic component and said second electronic component are within a communications system and wherein, said first signal is a local oscillator signal, said first frequency is a local oscillator frequency, said second signal is a radio frequency signal, said second frequency is a carrier frequency, said third signal is an intermediate frequency signal, and said third frequency is an intermediate frequency.

13. A method for generating high frequency harmonic signals from a source signal having a fundamental frequency, the method including in combination, the steps of:

A. receiving said source signal at a first terminal of an electronic component having a gain frequency characteristic with a unity gain frequency that is determined by a component current, comprised of a DC current and a small signal current, flowing through said electronic component, said small signal current being determined by a signal on said first terminal;

B. operatively connecting a capacitor between a second terminal of said electronic component and a reference voltage source;

C. generating an infinite effective capacitance and a negative effective resistance which produce parametric amplification at said first terminal and with respect to said reference voltage source, when said source signal is at a firing voltage point, to result in an increase in said DC current flowing through said electronic component; and D. producing said high frequency harmonic signals comprised of harmonic frequencies that are integer multiples of said fundamental frequency from said increase in said DC current, at a third terminal of said electronic component.

14. The method of claim 13 wherein, said electronic component is a Bipolar Junction Transistor (BJT) having a Beta current-gain frequency characteristic responsive to said component current, and wherein, said first terminal is a base terminal of said BJT, said second terminal is an emitter terminal of said BJT, and said third terminal is a collector terminal of said BJT, and said reactive component is a capacitor.

15. A method for mixing a local oscillator signal, having a local oscillator frequency, with a radio frequency signal having a carrier frequency, the method including in combination, the steps of:

A. providing a reactance that is a non-linear function of a signal at a first terminal of an electronic component and with respect to a reference voltage source, said electronic component having a gain frequency characteristic with a unity gain frequency, step A further including in combination, the steps of:

i. generating a component current through said electronic component, comprised of a DC current and a small signal current that is responsive to said signal, that determines said unity gain frequency of said electronic component;

ii. operatively connecting a reactive component between a second terminal of said electronic component and said reference voltage source;

iii. producing an impedance comprising a resistance and a reactance that are non-linear functions of said signal, at said first terminal of said electronic component and with respect to said reference voltage source; and iv. canceling out said resistance by operatively connecting a predetermined resistive component to said second terminal;

B. receiving said local oscillator signal at one of said first and second terminals;

C. receiving said radio frequency signal at one of said first and second terminals; and D. generating a mixed signal comprised of an intermediate frequency signal, having an intermediate frequency that is a difference of said local oscillator frequency and said carrier frequency, and having a gain factor, at said intermediate frequency, that is said unity gain frequency divided by said intermediate frequency, and that is modulated on said local oscillator signal, at a third terminal of said electronic component.

16. The method of claim 15 wherein, said electronic component is a Bipolar Junction Transistor (BJT) having a Beta current-gain frequency characteristic responsive to said component current flowing through said BJT, and wherein, said first terminal is a base terminal of said BJT, said second terminal is an emitter terminal of said BJT, and said third terminal is a collector terminal of said BJT, and said reactive component is a capacitor.

17. The method of claim 15, further including in combination, the step of:

E. filtering said mixed signal with an IF filter tuned to said intermediate frequency to selectively pass through said intermediate frequency signal.

18. The method of claim 15, further including in combination, the step of:

F. separating out an amplified radio frequency signal from said modulation of said intermediate frequency signal on said local oscillator signal, said amplified radio frequency signal having said gain factor as part of a total radio frequency gain.

19. The method of claim 15, further including in combination, the steps of:

G. operatively coupling said local oscillator signal to a first second-component terminal of a second electronic component;

H. operatively coupling said mixed signal to a second second-component terminal of said second electronic component;

I. configuring said second electronic component into a reactive mixer to mix said local oscillator signal with said mixed signal; and J. generating said intermediate frequency signal without modulation on said local oscillator signal, from said mixing of said local oscillator signal with said mixed signal, at a third second-component terminal of said second electronic component.

20. A high frequency harmonic generator comprising, in combination:

a signal source that provides a source signal having a fundamental frequency;

an electronic component having a first component terminal operatively connected to said signal source, a second component terminal, and a third component terminal, and having a gain frequency characteristic with a unity gain frequency determined by a component current, comprised of a DC current and a small signal current which is proportional to a signal at said first component terminal, flowing through said electronic component;

a reactive component, operatively connected between said second component terminal and a reference voltage source, having a reactance value that determines a negative effective resistance and an effective reactance that is a non-linear variable function of said signal, said negative effective resistance and said effective reactance being generated at said first component terminal with respect to said reference voltage; and an output terminal, operatively connected to said third component terminal, that provides high frequency harmonic signals, comprised of harmonic frequencies that are integer multiples of said fundamental frequency, that result from a sudden increase in said DC current when said source signal is at a firing voltage point in response to said negative effective resistance, an infinite effective capacitance, and parametric amplification that are produced at said firing voltage point.

21. The high frequency harmonic generator of claim 20 wherein, said electronic component is a Bipolar Junction Transistor (BJT) having a Beta current-gain frequency characteristic responsive to said component current flowing through said BJT, and wherein, said first component terminal is a base terminal of said BJT, said second component terminal is an emitter terminal of said BJT, said reactive component is a capacitor, and said reactance is a non-linear variable capacitance.

22. A reactive mixer that mixes a first signal having a first frequency with a second signal having a second frequency, the reactive mixer comprising, in combination:

an electronic component having a first component terminal that provides, with respect to a reference voltage source, a resistance and a reactance that are non-linear functions of a signal, and having a second component terminal, a third component terminal, and a gain frequency characteristic with a unity gain frequency determined by a component current flowing through said electronic component, said component current being comprised of a DC current and a small signal current that is responsive to said signal;

a reactive component, operatively connected between said second component terminal and said reference voltage source, having a reactive value that determines said resistance and said reactance;

a first input terminal, operatively connected to one of said first component terminal and said second component terminal, that receives said first signal;

a second input terminal, operatively connected to one of said first component terminal and said second component terminal, that receives said second signal; and an output terminal, operatively connected to said third component terminal that provides a mixed signal comprised of a third signal having a third frequency that is a difference of said first frequency and said second frequency and having a gain, at said third frequency, that is said unity gain frequency divided by said third frequency, and that is modulated on said first signal.

23. The reactive mixer of claim 22, further comprising, in combination:

a resistive component, operatively connected between said second component terminal and said reference voltage source, having a resistive value that cancels out said resistance at said first component terminal with respect to said reference voltage source.

24. The reactive mixer of claim 22 wherein, said reactive mixer is within a communications system and wherein, said first signal is a local oscillator signal, said first frequency is a local oscillator frequency, said second signal is a radio frequency signal, said second frequency is a carrier frequency, said third signal is an intermediate frequency signal, and said third frequency is an intermediate frequency.

25. The reactive mixer of claim 22, wherein said electronic component is a Bipolar Junction Transistor (BJT) having a Beta current-gain frequency characteristic responsive to said component current flowing through said BJT and wherein, said first component terminal is a base terminal of said BJT, said second component terminal is an emitter terminal of said BJT, said third terminal is a collector terminal of said BJT, said reactive component is a capacitor, and said reactance is a non-linear variable capacitance.

26. The reactive mixer of claim 24, further comprising, in combination:
an IF filter, operatively connected to said output terminal, tuned to said intermediate frequency to selectively pass through said intermediate frequency signal from said mixed signal.

27. The reactive mixer of claim 24, further comprising, in combination:
an RF filter, operatively connected in series with an output resistor to said output terminal, tuned to said carrier frequency to separate out an amplified radio frequency signal from said modulation of said intermediate frequency signal on said local oscillator signal, said amplified radio frequency signal having said gain factor as part of a total radio frequency gain.

28. The reactive mixer of claim 22, further comprising, in combination:
a second electronic component having a first second-component terminal operatively connected to said output terminal to receive said mixed signal, a second second-component terminal operatively connected to said first input terminal to receive said first signal, and wherein, said second electronic component is configured as a second reactive mixer to mix said first signal with said mixed signal to produce said third signal without said modulation on said first signal.

29. The reactive mixer of claim 28, further comprising, in combination:
a feedback network, operatively connected between said second component terminal and said second second-component terminal, for increasing a Q-factor at said intermediate frequency.

30. A capacitive mixer that mixes a local oscillator signal having a local oscillator frequency with a radio frequency signal having a carrier frequency, the capacitive mixer comprising, in combination:
a first BJT having a first base terminal that provides, with respect to a reference voltage source, a resistance and a capacitance that are non-linear functions of a signal, and having a first emitter terminal, a first collector terminal, and a gain frequency characteristic with a unity gain frequency determined by a component current flowing through said BJT, said component current comprised of a DC current and a small signal current that is proportional to said signal;
a capacitor, operatively connected between said first emitter terminal and said reference voltage source, that determines said capacitance that is said non-linear function of said signal;
a resistor, operatively connected between said first emitter terminal and said reference voltage source, that cancels out said resistance such that said electronic component is substantially a purely capacitive mixer;
a first input terminal, operatively connected to one of said first base terminal and said first emitter terminal, that couples said local oscillator signal to said first BJT;
a second input terminal, operatively connected to one of said first base terminal and said first emitter terminal, that couples said radio frequency signal to said first BJT; and
an output terminal, operatively connected to said first collector terminal, that provides a mixed signal comprised of an intermediate frequency signal, having an intermediate frequency that is a difference of said local oscillator frequency and said carrier frequency, and having a gain factor at said intermediate frequency, that is said unity gain frequency divided by said intermediate frequency, and said intermediate frequency signal being modulated on said local oscillator signal.

31. The capacitive mixer of claim 30, further comprising, in combination:
an IF filter, operatively connected to said output terminal, tuned to said intermediate frequency to selectively pass through said intermediate frequency signal from said mixed signal.

32. The capacitive mixer of claim 30, further comprising, in combination:
an RF filter, operatively connected in series with an output resistor to said output terminal, tuned to said carrier frequency to separate out an amplified radio frequency signal from said modulation of said intermediate frequency signal on said local oscillator signal, said amplified radio frequency signal having said gain factor as part of a total radio frequency gain.

33. The capacitive mixer of claim 30, further comprising, in combination:
a second BJT having a second base terminal operatively coupled to said output terminal to receive said mixed signal, a second emitter terminal operatively connected to said first input terminal to receive said local oscillator signal and wherein, said second BJT is configured as a second capacitive mixer to mix said mixed signal with said local oscillator signal to produce said intermediate frequency signal without modulation on said local oscillator signal.

34. A high frequency harmonic generator comprising, in combination:
a signal source that provides a source signal having a fundamental frequency;
means for generating a negative effective resistance and a reactance that is a non-linear function of a signal, said means for generating being operatively connected to said signal source to provide an infinite effective capacitance and said negative effective resistance which produce parametric amplification when said source signal is at a firing voltage point, to result in an increase in said DC current; and
an output terminal, operatively connected to said means for generating, that provides high frequency harmonic signals comprised of harmonic frequencies that are integer multiples of said fundamental frequency produced from said increase in DC current.

35. A reactive mixer that mixes a first signal having a first frequency with a second signal having a second frequency, the reactive mixer comprising, in combination:

means for inputting a superposition of said first signal and said second signal;

means for generating a reactance that is a non-linear function of a signal, that mixes said first signal and said second signal; and an output terminal, operatively connected to said means for generating, that provides a mixed signal comprised of a third signal, having a third frequency that is a difference of said first frequency and said second frequency and having a gain factor, at said third frequency, that is said unity gain frequency divided by said third frequency, and that is modulated on said first signal.

36. The reactive mixer of claim 35, further comprising, in combination:

means for separating out an amplified second signal, from said modulation of said third signal on said first signal, said amplified second signal having said gain factor as part of a total second frequency gain.

37. The reactive mixer of claim 35, further comprising in combination:

means for separating out said third signal without modulation on said first signal.

* * * * *